US008148729B2

(12) United States Patent
Kim

(10) Patent No.: US 8,148,729 B2
(45) Date of Patent: Apr. 3, 2012

(54) ORGANIC LIGHT EMITTING DEVICE

(75) Inventor: Seungtae Kim, Gumi (KR)

(73) Assignee: LG Display Co., Ltd., Seoul (KR)

( * ) Notice: Subject to any disclaimer, the term of this patent is extended or adjusted under 35 U.S.C. 154(b) by 1130 days.

(21) Appl. No.: 11/966,431

(22) Filed: Dec. 28, 2007

(65) Prior Publication Data

US 2008/0265785 A1 Oct. 30, 2008

(30) Foreign Application Priority Data

Apr. 27, 2007 (KR) .................. 10-2007-0041629
May 16, 2007 (KR) .................. 10-2007-0047420

(51) Int. Cl.
*H01L 29/04* (2006.01)
*H01L 29/15* (2006.01)
(52) U.S. Cl. .............................. 257/72; 257/40; 257/59

(58) Field of Classification Search .............. 257/40, 257/59–72, E29.273
See application file for complete search history.

(56) References Cited

U.S. PATENT DOCUMENTS 7,053,407 B2 * 5/2006 Ma et al. .................. 257/72
7,999,265 B2 * 8/2011 Eguchi ..................... 257/72

* cited by examiner

*Primary Examiner* — Cuong Q Nguyen
(74) *Attorney, Agent, or Firm* — Morgan, Lewis & Bockius LLP

(57) ABSTRACT

An organic light emitting device is disclosed. The organic light emitting device includes a substrate, a display unit that is positioned on the substrate and includes a subpixel and a monitor pixel, a first line supplying a voltage to the subpixel and the monitor pixel, a second line supplying a direct current (DC) power to the monitor pixel, a third line that transfers an electrical signal used to display an image on the subpixel, and a shield layer that is positioned on or under the second line and is electrically connected to the first line.

12 Claims, 14 Drawing Sheets

ORGANIC LIGHT EMITTING DEVICE

This application claims the benefit of Korean Patent Application No. 10-2007-0041629 filed on Apr. 27, 2007 and No. 10-2007-0047420 filed on May 16, 2007, which is hereby incorporated by reference.

BACKGROUND OF THE DISCLOSURE

1. Field of the Disclosure

Exemplary embodiments relate to a display device and, more particularly, to an organic light emitting device.

2. Description of the Related Art

Out of flat panel display devices, a light emitting device is a self-emission display device that does not require a backlight unit and has such characteristics that it can be fabricated to be light and thin, its process can be simplified. Further, the light emitting device can be fabricated at a low temperature, has a high response speed of 1 ms or lower, low power consumption, a wide viewing angle, and high contrast ratio, etc.

In particular, an organic light emitting device includes an emitting layer including an organic material between an anode electrode and a cathode electrode. The organic light emitting device forms an exciton, which is a hole-electron pair, by combining holes received from the anode electrode and electrons received from the cathode electrode inside the organic light-emitting layer, and emits light by energy generated when the exciton returns to a ground level. The organic light emitting display further comprises a hole (electron) injecting layer and/or a hole (electron) transporting layer between the anode or the cathode and the emitting layer.

Because the organic light emitting device includes the emitting layer including the organic material, it is easily degraded when external moisture or oxygen is infiltrated into the display device. Also, as a driving time of the organic light emitting device is lengthened, the emitting layer is readily degraded by heat generated in a driving unit.

In addition, having the semiconductor characteristics, the emitting layer is very sensitive to external temperature. Namely, the amount of current flowing in a light emitting diode changes readily as an ambient temperature goes up or down.

Thus, because the amount of voltage to be applied to obtain the same luminance varies according to a degradation degree or according to the surroundings, the organic light emitting device has disadvantages in that it can hardly provide a uniform quality of screen images.

Therefore, in order to compensate the degradation degree of the organic light emitting device or the voltage value changing according to temperature, monitor pixels are formed at a non-emission area near a display unit.

The monitor pixels include light emitting diodes formed in the same process as that of subpixels of the organic light emitting device and receive direct current (DC) power of a certain magnitude during a certain time. A magnitude of the voltage at the monitor pixels may be measured and provided to the subpixels of the display unit to thus compensate the voltage according to degradation or temperature.

However, measurement of voltage of the monitor pixels is performed while the organic light emitting device is being driven, so a problem arises in that there is a deviation in each size of measured voltages.

In other words, because the signal applied to the monitor pixels is DC power and a data signal applied to the subpixels is an alternating current (AC) signal, a signal interference is caused between lines transferring the DC power to the monitor pixels and lines transferring the data signal to the subpixels positioned to be adjacent to the monitor pixels, resulting in that the size of the measured voltage may be different. Thus, it is difficult to provide an accurate compensation voltage in consideration of the degradation of the subpixels of the display unit and temperature.

SUMMARY OF THE DISCLOSURE

Exemplary embodiments provide an organic light emitting device capable of providing uniform image quality by preventing interference between lines.

In an aspect, an organic light emitting device comprises a substrate, a display unit on the substrate, the display unit including a subpixel and a monitor pixel, a first line that supplies a voltage to the subpixel and the monitor pixel, a second line that supplies a direct current (DC) power to the monitor pixel, a third line that transfers an electrical signal used to display an image on the subpixel, and a shield layer that is positioned on or under the second line and is electrically connected to the first line.

In another aspect, an organic light emitting device comprises a substrate, a display unit on the substrate, the display unit including a subpixel and a monitor pixel, a first line that supplies a voltage to the subpixel and the monitor pixel, a second line that supplies a direct current (DC) power to the monitor pixel, a third line that transfers an electrical signal used to display an image on the subpixel, and a dummy line that is positioned between the second and third lines and is electrically connected to the first line.

In yet another aspect, an organic light emitting device comprises a substrate, a display unit on the substrate, the display unit including a subpixel, a first line that supplies a voltage to the subpixel, a second line that transfers an electrical signal used to display an image on the subpixel, and a shield layer positioned on or under the first line.

BRIEF DESCRIPTION OF THE DRAWINGS

The accompanying drawings, which are included to provide a further understanding of the invention and are incorporated on and constitute a part of this specification, illustrate embodiments of the invention and together with the description serve to explain the principles of the invention. In the drawings.

DETAILED DESCRIPTION OF EMBODIMENTS

Reference will now be made in detail embodiments of the invention examples of which are illustrated in the accompanying drawings.

Figure 1:
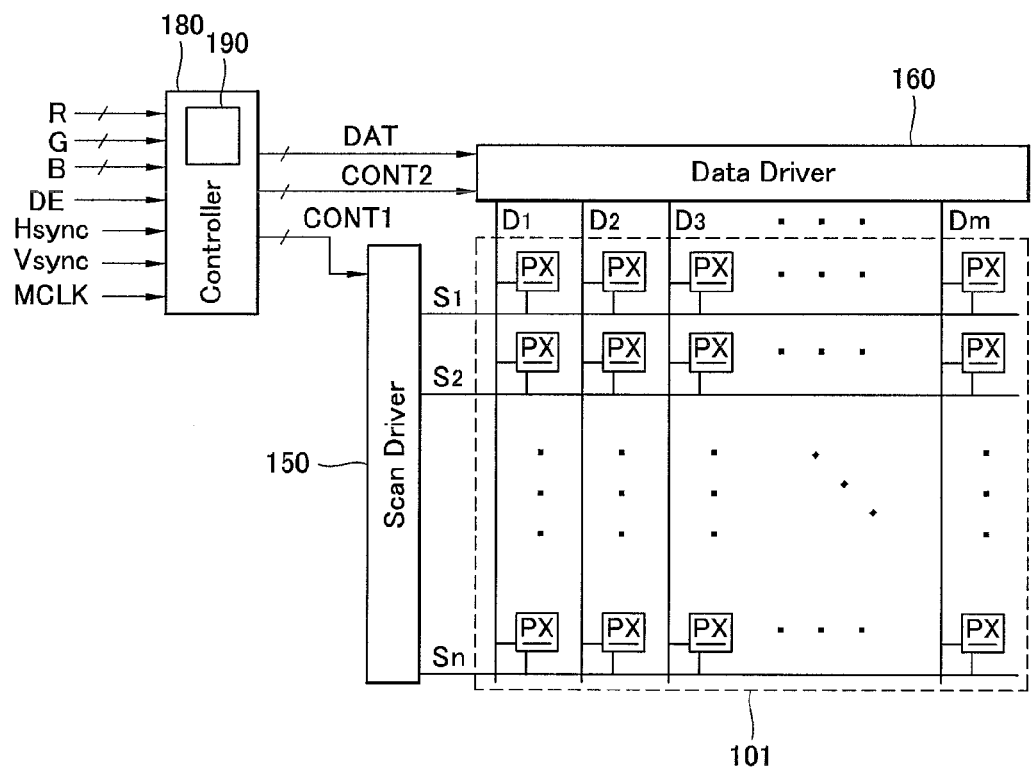
FIG. 1 is a bock diagram of an organic light emitting device according to an exemplary embodiment.

FIG. 1 is a bock diagram of an organic light emitting device according to an exemplary embodiment.

As shown in FIG. 1, the organic light emitting device according to the exemplary embodiment includes a display panel 101, a scan driver 150, a data driver 160, and a controller 180.

The display panel 101 includes a plurality of signal lines S1 to Sn and D1 to Dm, a plurality of power supply lines (not shown), and a plurality of subpixels PX connected to the signal lines S1 to Sn and D1 to Dm and the power supply lines in a matrix form. The display panel 101 may further include monitor pixels.

The plurality of signal lines S1 to Sn and D1 to Dm may include the plurality of scan lines S1 to Sn for sending scan signals and the plurality of data lines D1 to Dm for sending data signals. Each power supply line may send voltages such as a power voltage VDD to each subpixel PX.

Although the signal lines include the scan lines S1 to Sn and the data lines D1 to Dm in FIG. 1, the exemplary embodiment is not limited thereto. The signal lines may further include erase lines (not shown) for sending erase signals depending on a driving manner.

However, an erase line may not be used to send an erase signal. The erase signal may be sent through another signal line. For instance, although it is not shown, the erase signal may be supplied to the display panel 101 through the power supply line in case that the power supply line for supplying the power voltage VDD is formed.

Figure 2:
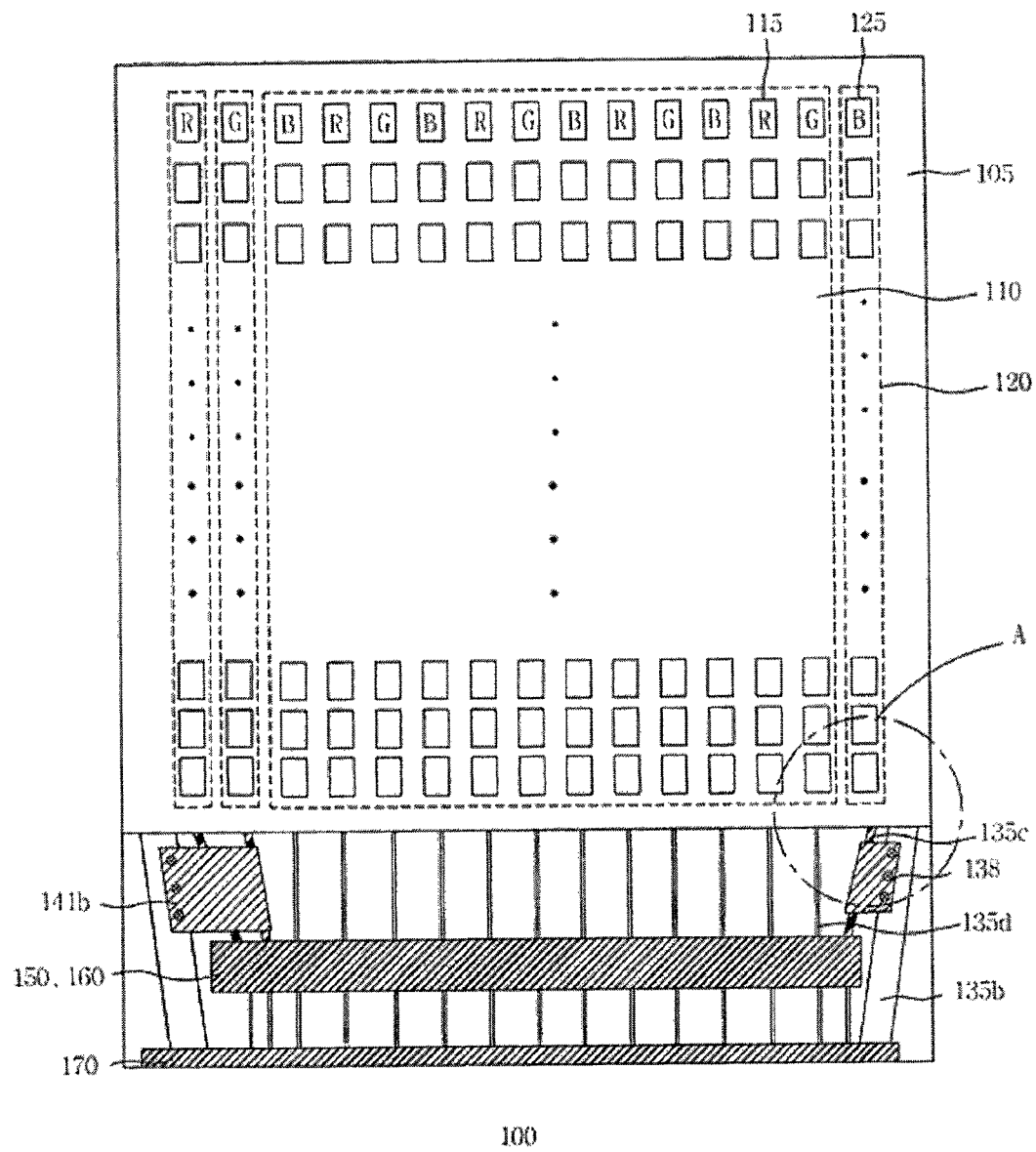
FIG. 2 is a plan view of an organic light emitting device according to a first exemplary embodiment.
Figure 3:
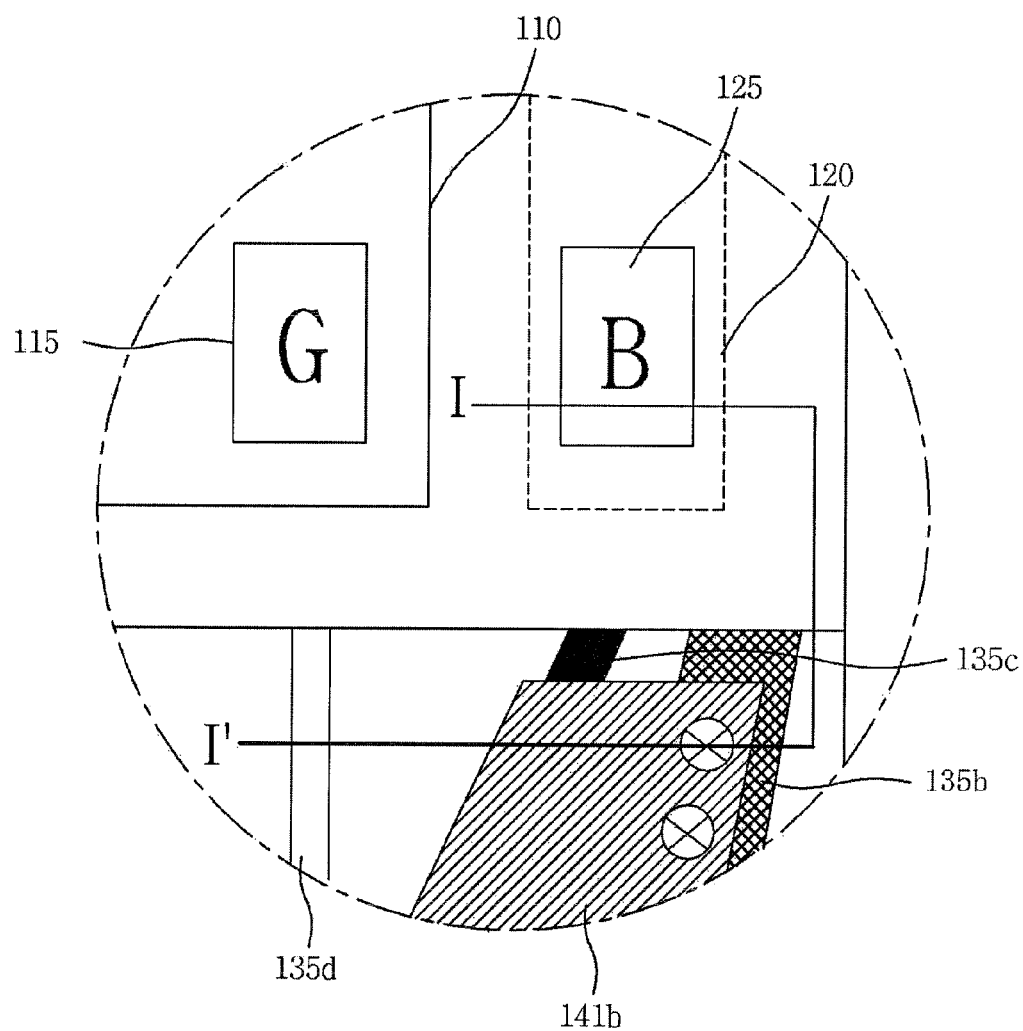
FIG. 3 is an enlarged view of a portion 'A' of FIG. 2.

FIG. 2 is a plan view of an organic light emitting device according to a first exemplary embodiment, and FIG. 3 is an enlarged view of a portion 'A' of FIG. 2.

As shown in FIGS. 2 and 3, an organic light emitting device according to the first exemplary embodiment includes a substrate 105, a display unit 110 positioned on the substrate 105, and a monitoring unit 120 positioned outside the display unit 110.

The display unit 110 includes a plurality of red, green, and blue subpixels 115 that are positioned at each intersection of scan lines and data lines and used to display an image. The monitoring unit 120 includes red, green, and blue monitor pixels 125 arranged in a row by color.

The subpixels 115 and the monitor pixels 125 each include an organic light emitting diodes including a first electrode, an emitting layer and a second electrode. The first electrode may be a transmissive electrode including a transparent conductive layer, and the second electrode may be a reflective electrode. Accordingly, light generated in the emitting layer is reflected by the second electrode and emitted toward a rear surface of the substrate.

The subpixels and the monitor pixels of the organic light emitting device according to the first exemplary embodiment will be described in detail with reference to FIGS. 5A to 7.

Figure 5A:
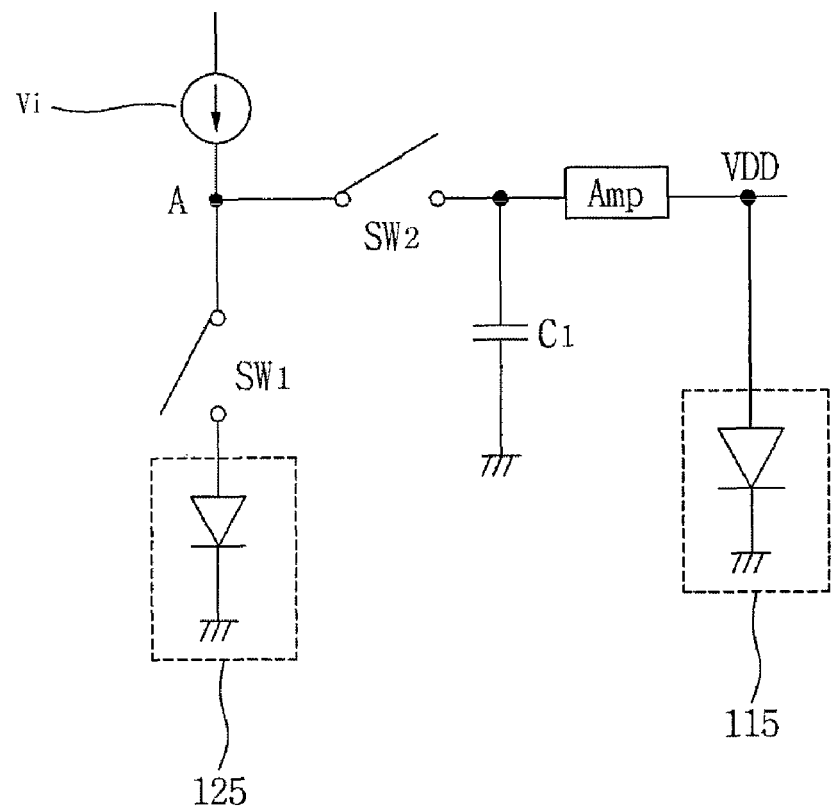
FIGS. 5A and 5B are a circuit diagram and a timing view for explaining a method for supplying a power to a monitoring unit and a display unit of the organic light emitting device according to the exemplary embodiment.
Figure 5B:
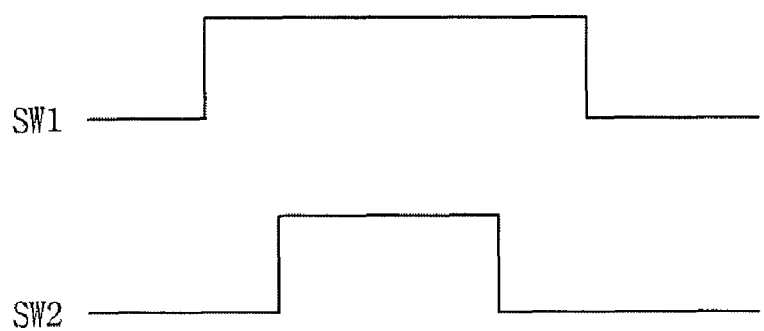
Figure 6:
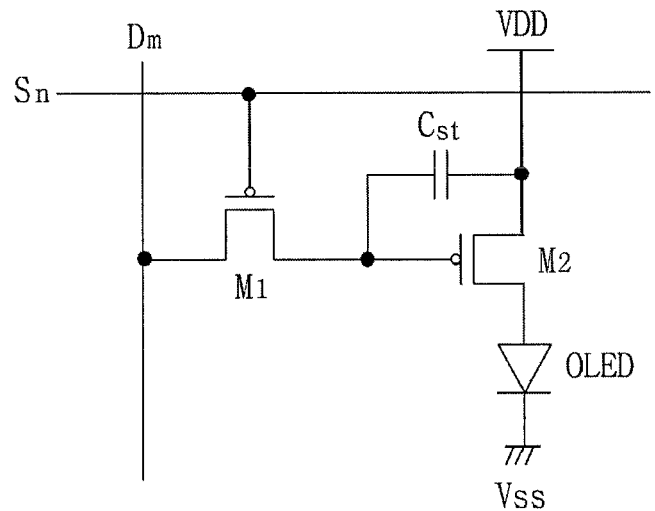
FIG. 6 is a circuit diagram of a subpixel of the organic light emitting device according to the exemplary embodiment.
Figure 7:
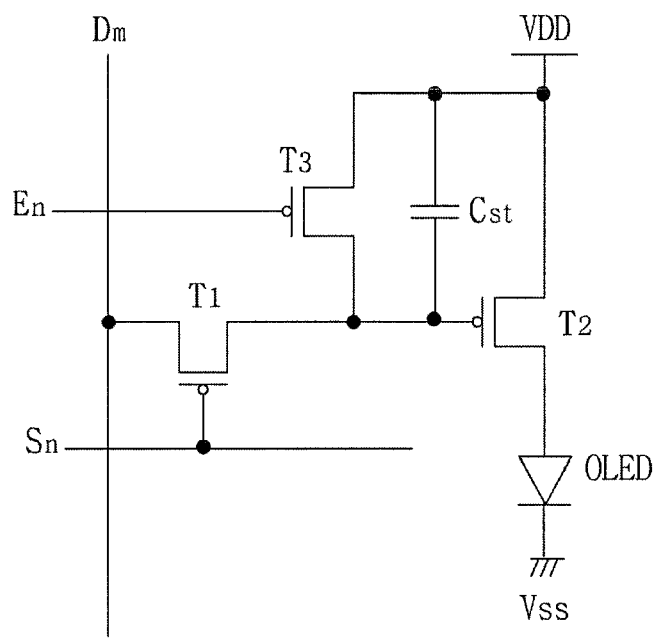
FIG. 7 is another circuit diagram of a subpixel of the organic light emitting device according to the exemplary embodiment.

FIGS. 5A and 5B are a circuit diagram and a timing view for explaining a method for supplying a power to a monitoring unit and a display unit of the organic light emitting device according to the exemplary embodiment. FIGS. 6 and 7 are circuit diagrams of a subpixel of the organic light emitting device according to the exemplary embodiment.

As shown in FIG. 5A, a direct current (DC) power supply unit Vi is connected to the monitor pixel 125, and a first switch SW1 is positioned between the monitor pixel 125 and the DC power supply unit Vi. The DC power supply unit Vi performs or stops the supply of DC power to the monitor pixel 125 depending on an ON or OFF operation of the first switch SW1.

The subpixel 115 is connected to a node 'A' between the DC power supply unit Vi and the first switch SW1. A second switch SW2 is positioned between the subpixel 115 and the node 'A', and a capacitor C1 is positioned between the second switch SW2 and the subpixel 115. An amplifier Amp may be positioned between the capacitor C1 and the subpixel 115.

The monitor pixel 125 includes at least an organic light emitting diode. Although it is not shown, the monitor pixel 125 may further include a thin film transistor (TFT). The subpixel 115 includes an organic light emitting diode, and may have a subpixel circuit structure shown in FIGS. 6 and 7.

As shown in FIG. 6, the subpixel may include a first transistor M1 that transfers a data signal through a scan line Sn in response to a scan signal, a capacitor Cst that stores the data signal, a second transistor M2 that produces a drive current corresponding to a difference between the data signal stored in the capacitor Cst and a power voltage VDD, and an organic light emitting diode that emits light corresponding to the drive current.

As shown in FIG. 7, the subpixel may include a first transistor T1 that transfers a data signal through the scan line Sn in response to a select signal, a capacitor Cst that stores the data signal, a second transistor T2 that produces a drive current corresponding to a difference between the data signal stored in the capacitor Cst and a power voltage VDD, an organic light emitting diode that emits light corresponding to the drive current, and a third transistor T3 that erases the data signal stored in the capacitor Cst from an erase line En in response to the select signal.

In the subpixel circuit shown in FIG. 7, when the organic light emitting device is driven using a digital driving method in which gray scale is represented by dividing one frame into a plurality of subfields, an erase signal may be supplied to subfields whose light-emission time is shorter than addressing time to thus control the illumination time. Thus, a minimum luminance of the organic light emitting device can be advantageously lowered.

A difference between driving voltages, e.g., a difference between a first power voltage VDD and a second power voltage Vss of the organic light emitting device may change depending on the size of the display panel and a driving manner. A magnitude of the driving voltage is shown in the following Tables 1 and 2. Table 1 indicates a driving voltage magnitude in case of a digital driving manner, and Table 2 indicates a driving voltage magnitude in case of an analog driving manner.

TABLE 1

| Size (S) of display panel | VDD-Vss (R) | VDD-Vss (G) | VDD-Vss (B) |
| --- | --- | --- | --- |
| S < 3 inches | 3.5-10 (V) | 3.5-10 (V) | 3.5-12 (V) |
| 3 inches < S < 20 inches | 5-15 (V) | 5-15 (V) | 5-20 (V) |
| 20 inches < S | 5-20 (V) | 5-20 (V) | 5-25 (V) |

TABLE 2

| Size (S) of display panel | VDD-Vss (R, G, B) |
| --- | --- |
| S < 3 inches | 4~20 (V) |
| 3 inches < S < 20 inches | 5~25 (V) |
| 20 inches < S | 5~30 (V) |

The operation of the monitor pixel 125 and the subpixel 115 will be described with reference to FIGS. 5A and 5B as follows. When the first switch SW1 is turned on, DC power is supplied from the DC power supply unit Vi to the monitor pixel 125.

Thereafter, when the second switch SW2 is turned on, the voltage at the monitor pixel 125 according to the supplied DC power is stored in the capacitor C1. The stored voltage is amplified by the amplifier Amp to serve as a voltage supply source for driving the subpixel 115.

And then, when the second switch SW2 is turned off, the subpixel 115 is driven by the voltage stored in the capacitor C1 until the second switch SW2 is turned on again.

Namely, the monitor pixel 125 receives the DC power of a predetermined magnitude during a predetermined time interval, and the subpixel 115 receives the voltage of the same magnitude as a magnitude of the voltage applied to the monitor pixel 125 by the DC power.

A time period during which the monitor pixel 125 receives the DC power may be determined in order to make a degradation degree according to driving of the subpixel 115 and the monitor pixel 125 to adjust at a substantially equal level.

Accordingly, the monitor pixel 125 may reflect the degradation degree of the subpixel 115 as well as an ambient temperature, so it can provide a compensation voltage according to the temperature and the degradation to the subpixel. The measurement of the voltage of the monitor pixel 125 may be performed at each frame or at every some frames.

Referring again to FIG. 1, the scan driver 150 is connected to the scan lines S1 to Sn of the display panel 101 to apply scan signals capable of turning on the switching thin film transistor T1 to the scan lines S1 to Sn, respectively.

The data driver 160 is connected to the data lines D1 to Dm of the display panel 101 to apply data signals indicating an output video signal DAT' to the data lines D1 to Dm, respectively. The data driver 160 may include at least one data driving integrated circuit (IC) connected to the data lines D1 to Dm.

The data driving IC may include a shift register, a latch, a digital-to-analog (DA) converter, and an output buffer connected to one another in the order named.

When a horizontal sync start signal (STH) (or a shift clock signal) is received, the shift register can send the output video signal DAT' to the latch in response to a data clock signal (HLCK). In case that the data driver 160 includes a plurality of data driving ICs, a shift register of a data driving IC can send a shift clock signal to a shift register of a next data driving IC.

The latch memorizes the output video signal DAT', selects a gray voltage corresponding to the memorized output video signal DAT' in response to a load signal, and sends the gray voltage to the output buffer.

The DA converter selects the corresponding gray voltage in response to the output video signal DAT' and sends the gray voltage to the output buffer.

The output buffer outputs an output voltage (serving as a data signal) received from the DA converter to the data lines D1 to Dm, and maintains the output of the output voltage for 1 horizontal period (1H).

The controller 180 controls an operation of the scan driver 150 and an operation of the data driver 160. The controller 180 may include a signal conversion unit 190 that gamma-converts input video signals R, G and B into the output video signal DAT' and produces the output video signal DAT'.

The controller 180 produces a scan control signal CONT1 and a data control signal CONT2 and the like. Then, the controller 180 outputs the scan control signal CONT1 to the scan driver 150 and outputs the data control signal CONT2 and the processed output video signal DAT' to the data driver 160.

The controller 180 receives the input video signals R, G and B and an input control signal for controlling the display of the input video signals R, G and B from a graphic controller (not shown) outside the organic light emitting device. Examples of the input control signal include a vertical sync signal Vsync, a horizontal sync signal Hsync, a main clock signal MCLK and a data enable signal DE.

Each of the driving devices 150, 160 and 180 may be directly mounted on the display panel 101 in the form of at least one IC chip, or may be attached to the display panel 101 in the form of a tape carrier package (TCP) in a state where the driving devices 150, 160 and 180 each are mounted on a flexible printed circuit film (not shown), or may be mounted on a separate printed circuit board (not shown).

Alternatively, each of the driving devices 150, 160 and 180 may be integrated on the display panel 101 together with the plurality of signal lines S1 to Sn and D1 to Dm or the thin film transistors T1, T2 and T3, and the like.

Further, the driving devices 150, 160 and 180 may be integrated into a single chip. In this case, at least one of the driving devices 150, 160 and 180 or at least one circuit element constituting the driving devices 150, 160 and 180 may be positioned outside the single chip.

Referring again to FIGS. 2 and 3, the drivers 150 and 160 are positioned on the substrate 105 to apply an electrical signal to the display unit 110 or the monitoring unit 120. The drivers 150 and 160 may include a scan driver or a data driver that applies a scan signal or a data signal to the display unit 110.

A pad unit 170 may be positioned at one end of the substrate 105. Although not shown, a connection unit connected to a printed circuit board (PCB) or having a PCB may be positioned on the pad unit 170.

The PCB may include a memory unit, a time controller, and a power supply unit. The pad unit 170 may transfer an electrical signal received from the PCB to the driver, or supply power to the display unit 110 or the monitoring unit 120.

One ends of lines are connected to the display unit 110 and the monitoring unit 120. The lines comprise first lines 135b that supply power to the display unit 110 and the monitoring unit 120, second lines 135c that supply DC power to the monitor pixels 125, and third lines 135d that apply electrical signals to the subpixels 115.

The first lines 135b may be reference voltage supply lines that apply a reference voltage to the display unit 110 and the monitoring unit 120, and the other ends of the second lines 135c may be connected to the driver 160.

The second lines 135c may be DC power supply lines that supply DC power to the monitor pixels 125, and the other ends of the second lines 135c may be connected to the drivers 150 and 160.

The third lines 135d may be data lines for supplying data signals to the subpixels 115, and the other ends of the third lines 135d may be connected to the drivers 150 and 160.

Thus, a voltage of uniform size (magnitude) is applied to the first lines 135b, a DC signal is applied to the second lines 135c, and an AC signal for displaying an image is applied to the third lines 135d.

In the first exemplary, it is shown that the other ends of the second lines 135c are connected to the drivers 150 and 160 on the assumption that the DC power supply unit supplying DC power to the monitor pixels 125 is positioned within the drivers 150 and 160. But, the DC power supply unit may be positioned within the PCB, and in this case, the other ends of the second lines 135c may be connected to the pad unit 170.

A shield layer 141b may be positioned at an upper portion of the second lines 135c. The shield layer 141b may be a conductive layer, and an insulating layer may be positioned between the second lines 135c and the shield layers 141b. The shield layer 141b may be electrically connected to the first lines 135b through the insulating layer.

That is, the organic light emitting device according to the first exemplary embodiment is constructed such that the shield layers 141b are formed at the upper portions of the second lines 135c for supplying DC power to the monitoring unit 120 and electrically connected to the first lines 135b through via holes 138. Accordingly, the reference voltage is applied to the shield layers 141b.

The third lines 135d positioned to be adjacent to the second lines 135c form capacitance together with the shield layers 141b. Thus, the signal interference between the second and third lines 135c and 135d which was caused in the related art can be prevented, and the second lines 135c can supply accurately the DC power to the monitoring unit 120.

Figure 4:
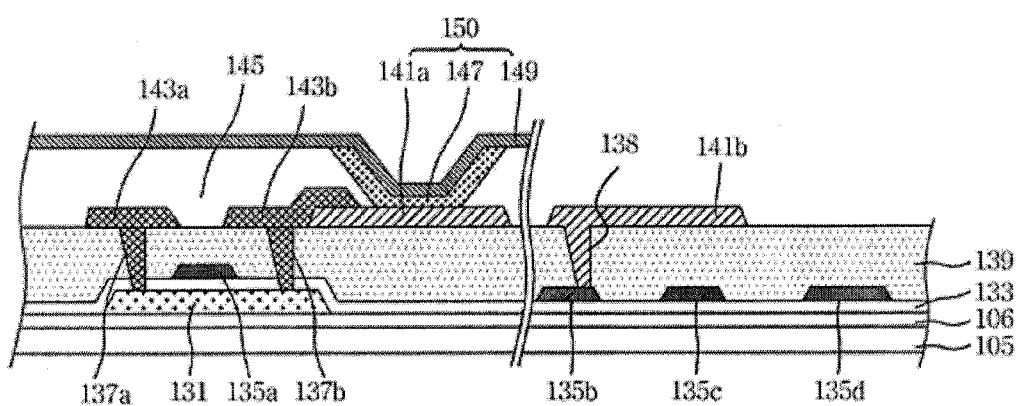
FIG. 4 is a cross-sectional view taken along line I-I' of FIG. 3.

FIG. 4 is a cross-sectional view taken along line I-I' of FIG. 3. The sectional structure of the organic light emitting device according to the first exemplary embodiment will now be described in detail with reference to FIGS. 2 to 4.

As shown in FIGS. 2 to 4, a buffer layer 106 is positioned on the substrate 105. The buffer layer 106 protects TFTs formed in a succeeding process against impurities such as alkali ions discharged from the substrate 105. The buffer layer 106 is selectively formed using silicon oxide ($SiO_2$), silicon nitride ($SiN_x$), or using other materials.

A semiconductor layer 131 is positioned on the buffer layer 106. The semiconductor layer 131 may include amorphous silicon or polycrystalline silicon obtained by crystallizing the amorphous silicon. Although not shown, the semiconductor layer 131 may comprise a channel region, a source region, and a drain region, and P-type or N-type impurities may be doped in the source and drain regions.

A gate insulating layer 133 is positioned on the substrate 105 including the semiconductor layer 131 formed thereon. The gate insulating layer 133 may be selectively formed using silicon oxide ($SiO_2$) or silicon nitride ($SiN_x$).

A gate electrode 135a is positioned on the gate insulating layer 133 to correspond to a predetermined area of the semiconductor layer 131 (i.e., a channel region). The first lines 135b supplying the reference voltage to the display unit 110 and the monitoring unit 120, the second lines 135c supplying DC power to the monitoring unit 120, and the third lines 135d applying electrical signals to display an image on the display unit 110 are positioned on a line area of the gate insulating layer 133.

The gate electrode 135a and the first to third lines 135b, 135c, and 135d may include one of aluminum (A), an Al alloy, titanium (Ti), silver (Ag), molybdenum (Mo), a Mo alloy, tungsten (W), and tungsten silicide ($WSi_2$).

An interlayer insulating layer 139 is positioned on the substrate 105 including the gate electrode 135a and the first to third lines 135b, 135c, and 135d formed thereon. The interlayer insulating layer 139 may be an organic layer or an inorganic layer, or a composite layer including the organic and inorganic layers.

When the interlayer insulating layer 139 is an inorganic layer, it may include silicon oxide ($SiO_2$), silicon nitride ($SiN_x$), or a silicate-on-glass (SOG). When the interlayer insulating layer 139 is an organic layer, it may include an acrylic resin, a polyimide-based resin, or a benzocyclobutene (BCB)-based resin.

The first and second contact holes 137a and 137b may be positioned in the interlayer insulating layer 139 and the gate insulating layer 133 to expose portions of the semiconductor layer 131, and the interlayer insulating layer 139 may comprise the via hole 138 exposing a portion of the first line 135b.

The first electrode 141a and the shield layer 141b are positioned on the interlayer insulating layer 139. The first electrode may be an anode and may include a transparent conductive layer made of a material such as ITO (Indium Tin Oxide) or IZO (Indium Zinc Oxide), etc.

The first electrode 141a may have a stacked structure such as ITO/Ag/ITO. The shield layer 141b is electrically connected to the first line 135b through the via hole 138, and positioned on an area corresponding to the second line 135c. Namely, the shield layer 141b comprises the same material as that of the first electrode 141a and is patterned in the same process.

Source and drain electrodes 143a and 143b are positioned on the interlayer insulating layer 139. The source and drain electrodes 143a and 143b are electrically connected to the first and second contact holes 137a and 137b. A portion of the drain electrode 143b is positioned on the first electrode 141a so as to be electrically connected therewith.

The source and drain electrodes 143a and 143b may include a low-resistance material so as to reduce a line resistance, and may have a multi-layered structure including moly-tungsten (MoW), titanium (Ti), aluminum (Al), or an Al alloy. Examples of the multi-layered structure include Ti/Al/Ti or MoW/Al/MoW.

A bank layer 145 is positioned on the first electrode 141a, exposing a portion of the first electrode 141a. The bank layer 145 may include an organic material such as the BCB-based resin, the acrylic resin, the polyimide-based resin, etc.

An emitting layer 147 is positioned on the exposed portion of the first electrode 141a. The emitting layer 147 may include an organic material. Although not shown, a hole injection layer or a hole transport layer may be formed between the first electrode 141a and the organic emitting layer 147, and an electron transport layer and an electron injection layer may be formed on the organic emitting layer 147.

A second electrode 149 is positioned on the emitting layer 147. The second electrode 149 may be a cathode electrode that supplies electrons to the emitting layer 147. The second electrode 149 may include magnesium (Mg), Ag, calcium (Ca), Al, or an alloy thereof. The first electrode 141a, the emitting layer 147, and the second electrode 149 constitute an organic light emitting diode 150.

As mentioned above, in the organic light emitting device according to the first exemplary embodiment, the shield layers are positioned on the second lines that supply DC power to the monitoring unit.

The shield layers are electrically connected to the first lines that supply the reference voltage to form the capacitance together with the third lines, thus preventing occurrence of a signal interference between the third lines that supply electrical signals to the display unit and the second lines.

Therefore, the organic light emitting device according to the first exemplary embodiment can have the uniform luminance and the improved image quality by transferring an accurate voltage from the monitoring unit to the display unit.

Figure 8A:
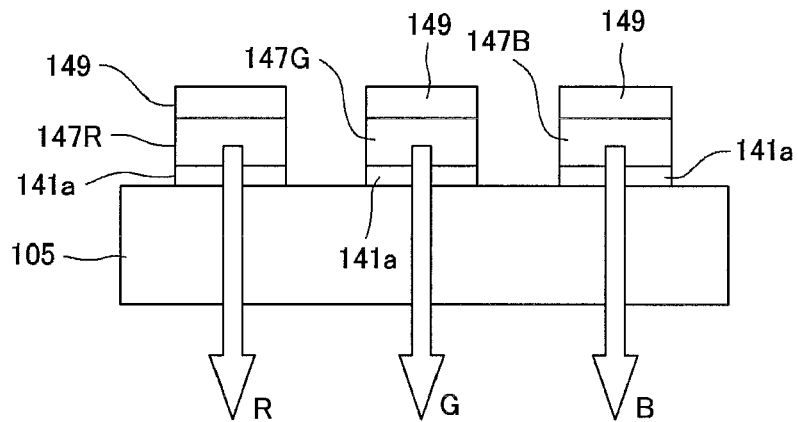
FIGS. 8A to 8C illustrate various implementations of a color image display method in the organic light emitting device according to the exemplary embodiment.
Figure 8B:
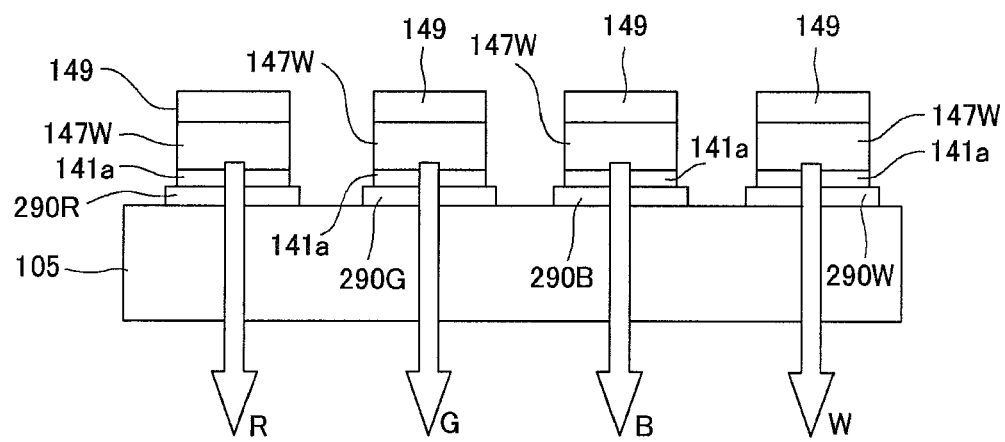
Figure 8C:
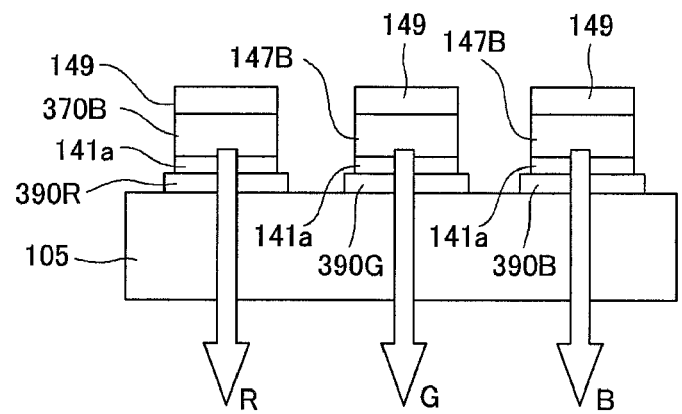

FIGS. 8A to 8C illustrate various implementations of a color image display method in the organic light emitting device according to the exemplary embodiment.

FIG. 8A illustrates a color image display method in an organic light emitting device separately including a red emitting layer 147R, a green emitting layer 147G and a blue emitting layer 147B which emit red, green and blue light, respectively.

The red, green and blue light produced by the red, green and blue emitting layers 147R, 147G and 147B is mixed to display a color image.

It may be understood in FIG. 8A that the red, green and blue emitting layers 147R, 147G and 147B each include an electron transporting layer, a hole transporting layer, and the like, on upper and lower portions thereof. It is possible to variously change the arrangement and the structure between the additional layers such as the electron transporting layer and the hole transporting layer and each of the red, green and blue emitting layers 147R, 147G and 147B.

FIG. 8B illustrates a color image display method in an organic light emitting device including a white emitting layer 147W, a red color filter 290R, a green color filter 290G, a blue color filter 290B, and a white color filter 290W.

As shown in FIG. 8B, the red color filter 290R, the green color filter 290G, the blue color filter 290B, and the white color filter 290W each transmit white light produced by the white emitting layer 147W to produce red light, green light, blue light, and white light. The red, green, blue, and white light is mixed to display a color image. The white color filter 290W may be removed depending on color sensitivity of the white light produced by the white emitting layer 147W and combination of the white light and the red, green and blue light.

While FIG. 8B has illustrated the color display method of four subpixels using combination of the red, green, blue, and white light, a color display method of three subpixels using combination of the red, green, and blue light may be used.

It may be understood in FIG. 8B that the white emitting layer 147W includes an electron transporting layer, a hole transporting layer, and the like, on upper and lower portions thereof. It is possible to variously change the arrangement and the structure between the additional layers such as the electron transporting layer and the hole transporting layer and the white emitting layer 147W.

FIG. 8C illustrates a color image display method in an organic light emitting device including a blue emitting layer 147B, a red color change medium 390R, a green color change medium 390G, a blue color change medium 390B.

As shown in FIG. 8C, the red color change medium 390R, the green color change medium 390G, and the blue color change medium 390B each transmit blue light produced by the blue emitting layer 147B to produce red light, green light and blue light. The red, green and blue light is mixed to display a color image.

The blue color change medium 390B may be removed depending on color sensitivity of the blue light produced by the blue emitting layer 147B and combination of the blue light and the red and green light.

It may be understood in FIG. 8C that the blue emitting layer 147B includes an electron transporting layer, a hole transporting layer, and the like, on upper and lower portions thereof. It is possible to variously change the arrangement and the structure between the additional layers such as the electron transporting layer and the hole transporting layer and the blue emitting layer 147B.

While FIGS. 8A and 8B have illustrated and described the organic light emitting device having a bottom emission structure, the exemplary embodiment is not limited thereto. The organic light emitting device according to the exemplary embodiment may have a top emission structure, and thus the structure of the organic light emitting device according to the exemplary embodiment may be changed depending on the top emission structure.

While FIGS. 8A to 8C have illustrated and described three kinds of color image display method, the exemplary embodiment is not limited thereto. The exemplary embodiment may use various kinds of color image display method whenever necessary.

Figure 9:
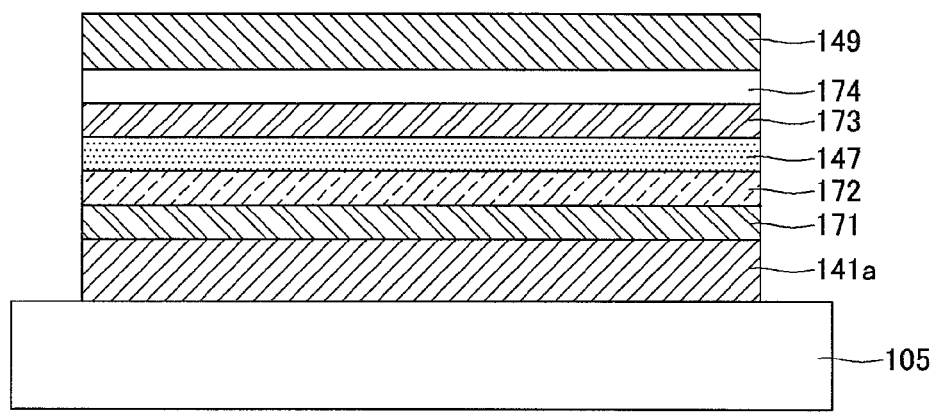
FIG. 9 is a cross-sectional view of the organic light emitting device according to the exemplary embodiment.

FIG. 9 is a cross-sectional view of the organic light emitting device according to the exemplary embodiment.

As shown in FIG. 9, the organic light emitting device according to the exemplary embodiment includes the substrate 105, the first electrode 141a positioned on the substrate 105, a hole injection layer 171 positioned on the first electrode 141a, a hole transporting layer 172, the emitting layer 147, an electron transporting layer 173, an electron injection layer 174, and the second electrode 149 positioned on the electron injection layer 174.

The hole injection layer 171 may function to facilitate the injection of holes from the first electrode 141a to the emitting layer 147. The hole injection layer 171 may be formed of at least one selected from the group consisting of copper phthalocyanine (CuPc), PEDOT(poly(3,4)-ethylenedioxythiophene), polyaniline (PANI) and NPD(N,N-dinaphthyl-N,N'-diphenyl benzidine), but is not limited thereto. The hole injection layer 171 may be formed using an evaporation method or a spin coating method.

The hole transporting layer 172 functions to smoothly transport holes. The hole transporting layer 172 may be formed from at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD and MTDATA(4,4',4"-Tris(N-3-methylphenyl-N-phenyl-amino)-triphenylamine), but is not limited thereto. The hole transporting layer 172 may be formed using an evaporation method or a spin coating method.

The emitting layer 147 may be formed of a material capable of producing red, green, blue or white light such as, for example, a phosphorescence material or a fluorescence material.

In case that the emitting layer 147 emits red light, the emitting layer 147 includes a host material including carbazole biphenyl (CBP) or N,N-dicarbazolyl-3,5-benzene (mCP). Further, the emitting layer 147 may be formed of a phosphorescence material including a dopant material including any one selected from the group consisting of PIQIr (acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum) or a fluorescence material including PBD:Eu(DBM)3(Phen) or Perylene, but is not limited thereto.

In case that the emitting layer 147 emits green light, the emitting layer 147 includes a host material including CBP or mCP. Further, the emitting layer 147 may be formed of a phosphorescence material including a dopant material including Ir(ppy)3(fac tris(2-phenylpyridine)iridium) or a fluorescence material including Alq3(tris(8-hydroxyquinolino)aluminum), but is not limited thereto.

In case that the emitting layer 147 emits blue light, the emitting layer 147 includes a host material including CBP or mCP. Further, the emitting layer 147 may be formed of a phosphorescence material including a dopant material including (4,6-F2 ppy)2Irpic or a fluorescence material including any one selected from the group consisting of spiro-DPVBi, spiro-6P, distyryl-benzene (DSB), distyryl-arylene (DSA), PFO-based polymers, PPV-based polymers and a combination thereof, but is not limited thereto.

The electron transporting layer 173 functions to facilitate the transportation of electrons. The electron transporting layer 173 may be formed of at least one selected from the group consisting of Alq3(tris(8-hydroxyquinolino)aluminum, PBD, TAZ, spiro-PBD, BAlq, and SAlq, but is not limited thereto. The electron transporting layer 173 may be formed using an evaporation method or a spin coating method.

The electron transporting layer 173 can also function to prevent holes, which are injected from the first electrode 141a and then pass through the emitting layer 147, from moving to the second electrode 149. In other words, the electron transporting layer 173 serves as a hole stop layer, which facilitates the coupling of holes and electrons in the emitting layer 147.

The electron injection layer 174 functions to facilitate the ejection of electrons. The electron injection layer 174 may be formed of Alq3(tris(8-hydroxyquinolino)aluminum), PBD, TAZ, spiro-PBD, BAlq or SAlq, but is not limited thereto.

The electron injection layer 174 may be formed of an organic material and an inorganic material forming the electron injection layer 174 through a vacuum evaporation method.

The hole injection layer 171 or the electron injection layer 174 may further include an inorganic material. The inorganic material may further include a metal compound. The metal compound may include alkali metal or alkaline earth metal.

The metal compound including the alkali metal or the alkaline earth metal may include at least one selected from the group consisting of LiQ, LiF, NaF, KF, RbF, CsF, FrF, $BeF_2$, $MgF_2$, $CaF_2$, $SrF_2$, $BaF_2$, and $RaF_2$, but is not limited thereto.

Thus, the inorganic material inside the electron injection layer 174 facilitates hopping of electrons injected from the second electrode 149 to the emitting layer 147, so that holes and electrons injected into the emitting layer 147 are balanced. Accordingly, emission efficiency can be improved.

Further, the inorganic material inside the hole injection layer 171 reduces the mobility of holes injected from the first electrode 141a to the emitting layer 147, so that holes and electrons injected into the emitting layer 147 are balanced. Accordingly, light emission efficiency can be improved.

At least one of the electron injection layer 174, the electron transporting layer 173, the hole transporting layer 172, the hole injection layer 171 may be omitted.

Figure 10:
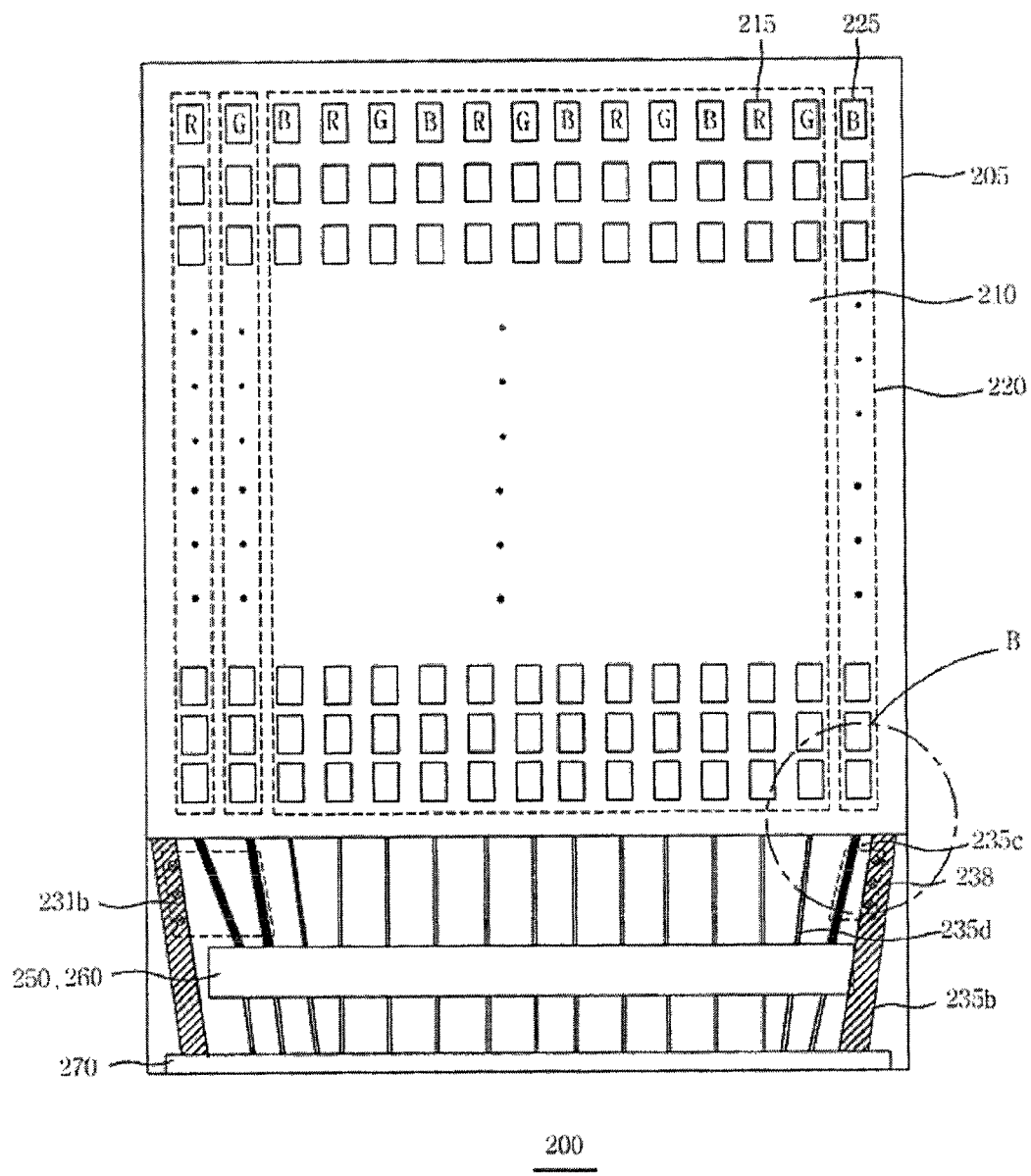
FIG. 10 is a plan view of an organic light emitting device according to a second exemplary embodiment.
Figure 11:
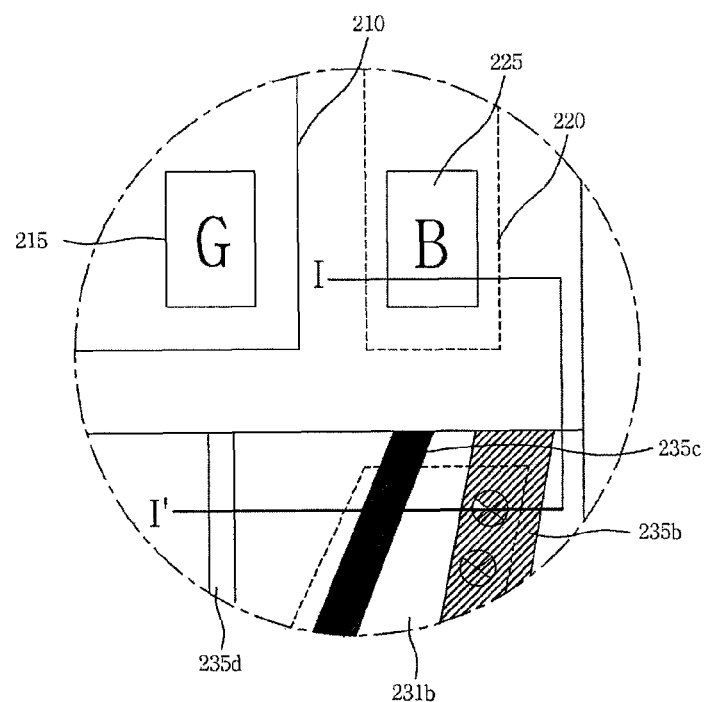
FIG. 11 is an enlarged view of a portion 'B' of FIG. 10.
Figure 12:
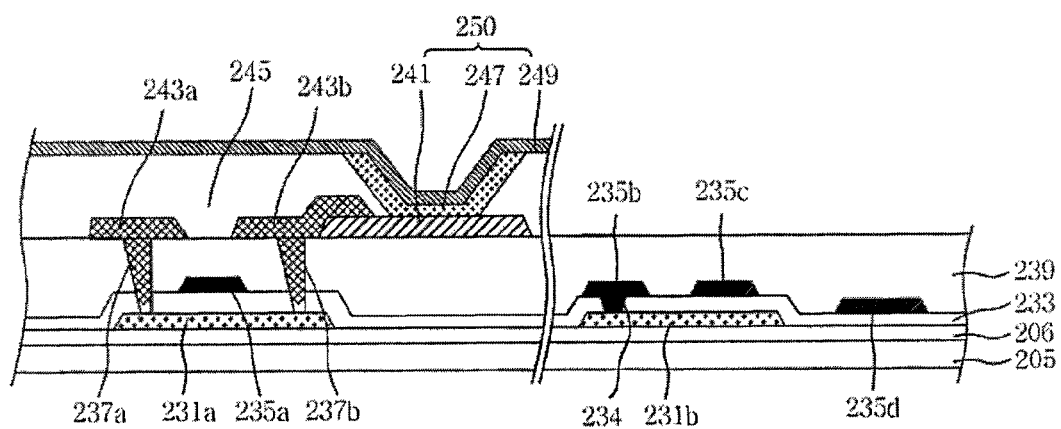
FIG. 12 is a cross-sectional view taken along line I-I' of FIG. 11.

FIG. 10 is a plan view of an organic light emitting device according to a second exemplary embodiment, FIG. 11 is an enlarged view of a portion 'B' of FIG. 10, and FIG. 12 is a cross-sectional view taken along line I-I' of FIG. 11.

The planar structure and sectional structure of the organic light emitting device according to the second exemplary embodiment will now be described. A description for the same elements as those of the first exemplary embodiment will be omitted.

As shown in FIGS. 10 to 12, the organic light emitting device according to the second exemplary embodiment comprises a buffer layer 206 positioned on a substrate 205 and a semiconductor layer 231a and a shield layer 231b positioned on the buffer layer 206. The shield layer 231b includes the same material as the semiconductor layer 231a and is patterned using the same mask process as the semiconductor layer 231a.

A gate insulating layer 233 is positioned on the semiconductor layer 231a and the shield layer 231b, and a via hole 234 is positioned inside the gate insulating layer 233 to expose a portion of the shield layer 231b.

A gate electrode 235a is positioned on the gate insulating layer 233 to correspond to a predetermined area of the semiconductor layer 231a.

First lines 235b for supplying a reference voltage to a display unit 210 and a monitoring unit 220, second lines 235c for supplying DC power to the monitoring unit 220, and third lines 235d for applying an electrical signal to display an image on the display unit 210 are positioned on a line area. The first lines 235b are connected to the shield layers 231b through the via holes 234.

An interlayer insulating layer 239 is positioned on the substrate 205 including the gate electrode 235a and the first to third lines 235b, 235c, and 235d formed thereon. First and second contact holes 237a and 237b are formed inside the interlayer insulating layer 239 and the gate insulating layer 233 to expose a portion of the semiconductor layer 231a.

A first electrode 241 is positioned on the interlayer insulating layer 239 and source and drain electrodes 243a and 243b are also positioned on the interlayer insulating layer 239. The source and drain electrodes 243a and 243b are electrically connected to the semiconductor layer 231a through the first and second contact holes 237a and 237b, and a portion of the drain electrode 243b is positioned on the first electrode 241 and electrically connected therewith.

A bank layer 245 is positioned on the first electrode 241, exposing a portion of the first electrode 241, and an emitting layer 247 including an organic material is positioned on the exposed portion of the first electrode 241.

A second electrode 249 is positioned on the emitting layer 247, and the first electrode 241, the emitting layer 247, and the second electrode 249 constitute an organic light emitting diode 250.

In the organic light emitting device according to the second exemplary embodiment as described above, the shield layers 231b are positioned at a lower portion of the second lines 235c that supply DC power to the monitoring unit 220.

The shield layers 231b are electrically connected to the first lines 235b to prevent occurrence of a signal interference between the third layers that supply electrical signals to the display unit and the second lines.

Therefore, the organic light emitting device according to the second exemplary embodiment can have the uniform luminance and improve the image quality because an accurate voltage can be transferred from the monitoring unit to the display unit.

Figure 13:
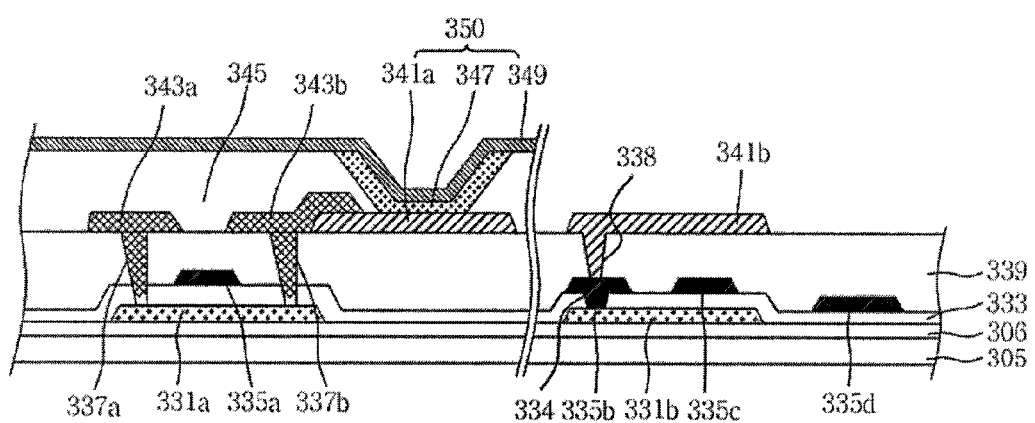
FIG. 13 is a cross-sectional view of an organic light emitting device according to a third exemplary embodiment.

FIG. 13 is a cross-sectional view of an organic light emitting device according to a third exemplary embodiment. The organic light emitting device according to the third exemplary embodiment includes a first shield layer simultaneously patterned together with a semiconductor layer and a second shield layer simultaneously patterned together with a first electrode.

As shown in FIG. 13, a buffer layer 306 is positioned on a substrate 305, and a semiconductor layer 331a and a first shield layer 331b are positioned on the buffer layer 306. The shield layer 331b includes the same material as the semiconductor layer 231a and is patterned using the same mask process as the semiconductor layer 231a.

A gate insulating layer 333 comprising a via hole 334 is positioned on the semiconductor layer 31a and the first shield layer 331.

A gate electrode 335a is positioned on the gate insulating layer 333 to correspond to a predetermined area of the semiconductor layer 331a.

A first line 335b for supplying a reference voltage to a display unit 310 and a monitoring unit 320, a second line 335c for supplying DC power to the monitoring unit, and a third line 335d for applying an electrical signal to display an image on the display unit 310 are positioned on a line area. The first line 335b is connected to the first shield layer 331b through the via hole 334.

An interlayer insulating layer 339 is positioned on the substrate 305 with the gate electrode 335a and the first to third lines 335b, 335c, and 335d formed thereon. First and second contact holes 337a and 337b are positioned in the interlayer insulating layer 339 and the gate insulating layer 333, and expose portions of the semiconductor layer 331a. A second via hole 338, exposing a portion of the first line 335b, is positioned in the interlayer insulating layer 339.

A first electrode 341a and a second shield layer 341b are positioned on the interlayer insulating layer 339, and source and drain electrodes 343a and 343b are also positioned on the interlayer insulating layer 339. The source and drain electrodes 343a and 343b are electrically connected to the semiconductor layer 331a through the first and second contact holes 337a and 337b, and a portion of the drain electrode 343b is positioned on the first electrode 341a and electrically connected therewith. The second shield layer 341b is electrically connected to the first line 335b through the second via hole 338.

A bank layer 345 is positioned on the first electrode 341a, exposing a portion of the first electrode 341a, and an emitting layer 347 including an organic material is positioned on the exposed portion of the first electrode 341a.

A second electrode 349 is positioned on the emitting layer 347, and the first electrode 341a, the emitting layer 347, and the second electrode 349 constitute an organic light emitting diode 350.

As described above, in the organic light emitting device according to the third exemplary embodiment, the first shield layer 3311b is positioned under the second line supplying the DC power to the monitoring unit 320, and the second shield layer 341b is positioned on of the second line.

The first and second shield layers 331b and 341b are electrically connected to the first line 335b supplying a reference voltage to prevent occurrence of a signal interference between the third line 335d supplying an electrical signal to the display unit 310 and the second line 335c.

Therefore, an accurate voltage can be transferred from the monitoring unit 320 to the display unit 310 by the shield layer formed without an additional masking process, so the organic light emitting device according to the third exemplary embodiment can have the uniform luminance and improved the image quality.

Figure 14:
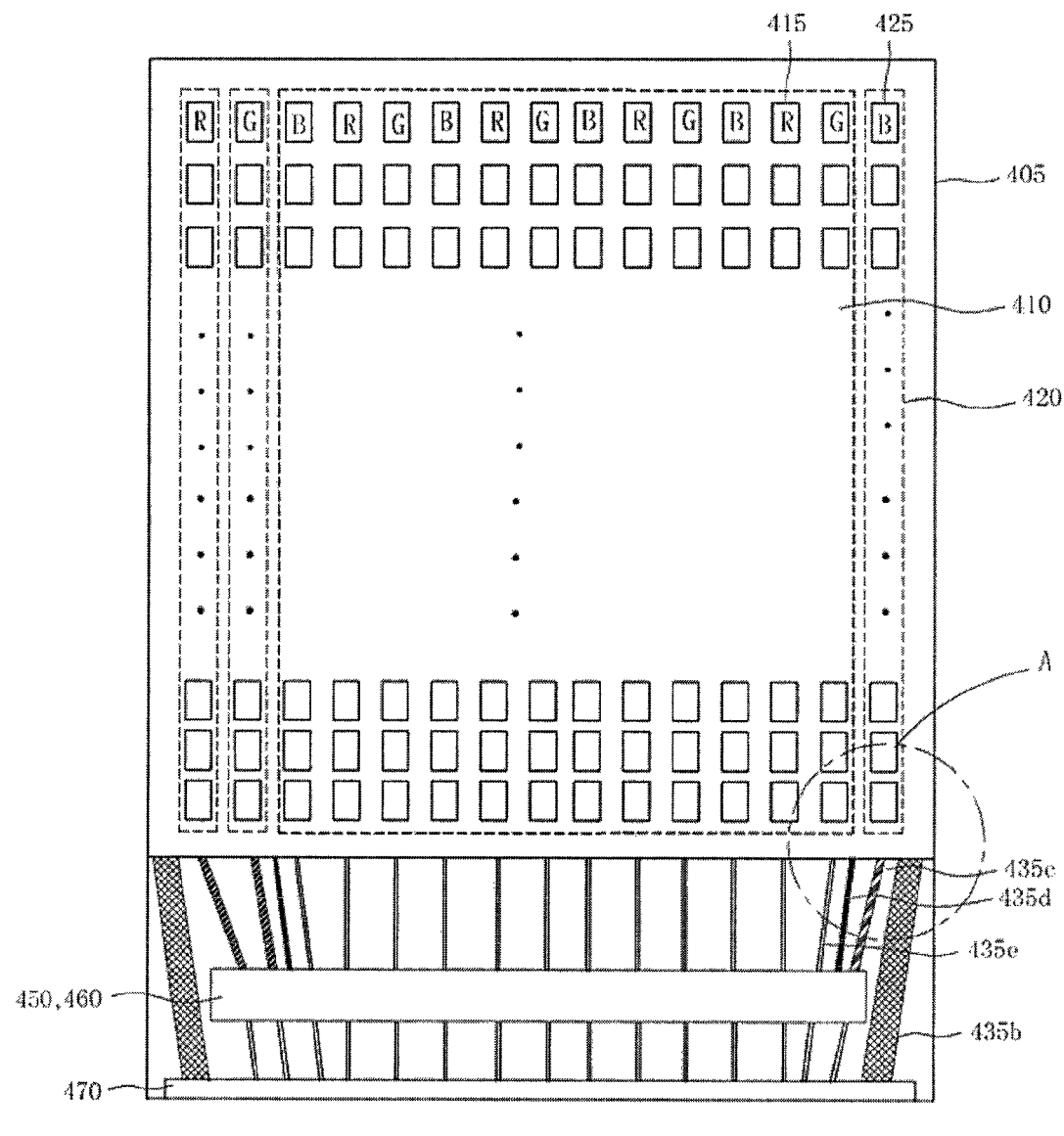
FIG. 14 is a plan view of an organic light emitting device according to a fourth exemplary embodiment.
Figure 15:
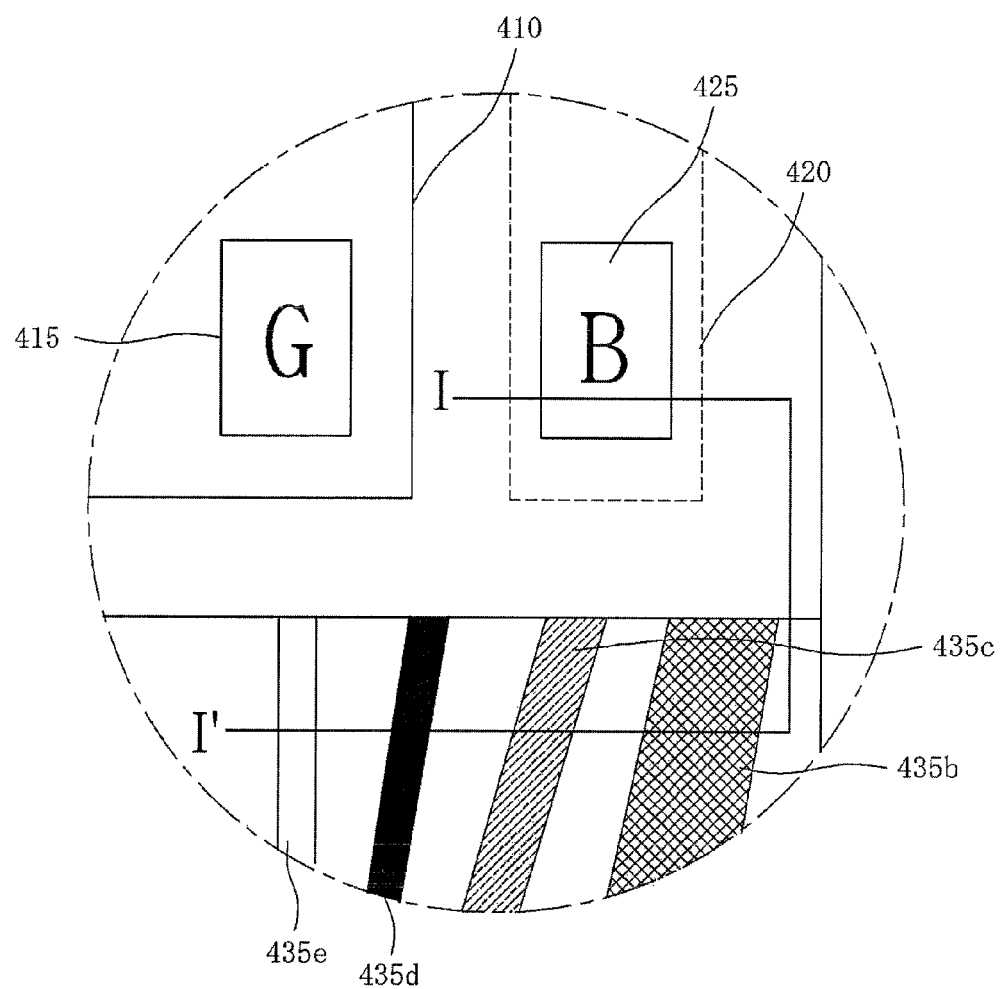
FIG. 15 is an enlarged view of a portion 'A' of FIG. 14.
Figure 16:
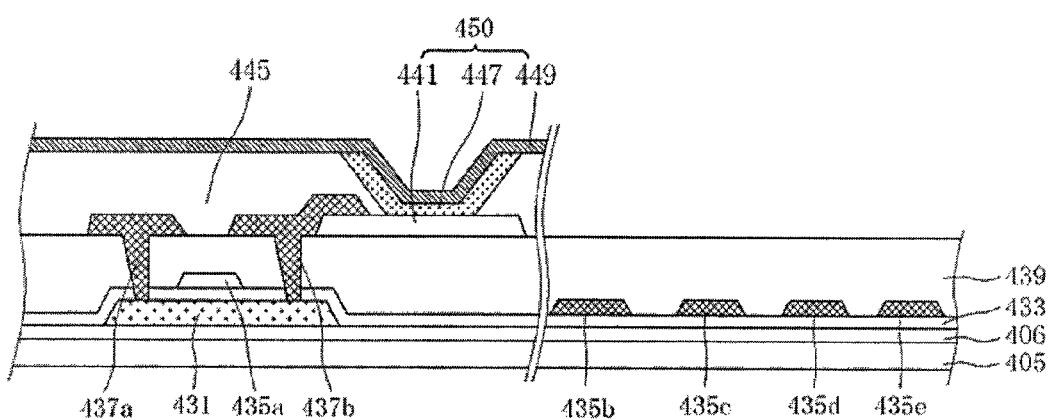
FIG. 16 is a cross-sectional view taken along line I-I' of FIG. 15.

FIG. 14 is a plan view of an organic light emitting device according to a fourth exemplary embodiment, FIG. 15 is an enlarged view of a portion 'A' of FIG. 14, and FIG. 16 is a cross-sectional view taken along line I-I' of FIG. 15.

The planar structure and sectional structure of the organic light emitting device according to the fourth exemplary embodiment will now be described. A description for the same elements as those of the first exemplary embodiment will be omitted.

As shown in FIGS. 14 and 15, the organic light emitting device according to the fourth exemplary embodiment comprises a substrate 405, a display unit 410 positioned on the substrate 405, and a monitoring unit 420 positioned outside the display unit 410.

Drivers 450 and 460 applying an electrical signal to the display unit 410 or the monitoring unit 420 is positioned on the substrate 405. The drivers 450 and 460 may include a scan driver or a data driver that applies a scan signal or a data signal to the display unit 410.

One ends of lines are connected to the display unit 410 and the monitoring unit 420. The lines include first lines 435c supplying power to the display unit 410 and the monitoring unit 420, second lines 435c supplying DC power to monitor pixels 425, and third lines 435e applying electrical signals to subpixels 415.

Dummy lines 435d may be positioned between the second lines 435c and the third lines 435e. The dummy lines 435d are electrically connected to the first lines 435b.

Although not shown, the dummy lines 435d may be patterned so as to be electrically connected to the first lines 435b inside the substrate 405 or at an end of the substrate 405. The dummy line 435d and the first line 435b may be electrically connected to each other through a connection electrode passing through an insulating layer positioned on or under the dummy line 435d and the first line 435b.

That is, the organic light emitting device according to the fourth exemplary embodiment comprises the dummy lines 435d positioned between the second lines 435c for supplying DC power to the monitoring unit 420 and the third lines 435e. The dummy lines 435d is electrically connected to the first lines 435b.

Accordingly, the third lines 435e adjacent to the second lines 435c and the dummy lines 435d form a capacitance. Thus, occurrence of such signal interference between the second lines 435c and the third lines 435e which was caused in the related art can be prevented, and the second lines 435c can supply accurate DC power to the monitoring unit 420.

The organic light emitting device according to the fourth exemplary embodiment comprises a buffer layer 406 on the substrate 405, and a semiconductor layer 431 on the buffer layer 406.

A gate insulating layer 433 is positioned on the substrate 405 including the semiconductor layer 431 formed thereon. A gate electrode 435a is positioned on the gate insulating layer 433 to correspond to a predetermined area of the semiconductor layer 431 (i.e., a channel region).

The first lines 135b supplying a reference voltage to the display unit 410 and the monitoring unit 420, the second lines 435c supplying the DC power to the monitoring unit 420, and the third lines 435e applying electrical signals to display an image on the display unit 410 are positioned on a line area of the gate insulating layer 433. The dummy lines 435d are positioned between the second lines 435c and the third lines 435e. Although it is not shown, the dummy lines 435d are electrically connected to the first lines 435b.

The gate electrode 435a, the first to third lines 135b, 135c, and 135d, and the dummy lines 435d may include one of aluminum (A), an Al alloy, titanium (Ti), silver (Ag), molybdenum (Mo), an Mo alloy, tungsten (W), and tungsten silicide (WSi2).

An interlayer insulating layer 439 is positioned on the substrate 405 with the gate electrode 435a, the first to third lines 435b, 435c, and 435e, and the dummy lines 435d formed thereon. First and second contact holes 437a and 437b may be positioned in the interlayer insulating layer 439 and the gate insulating layer 433 to expose portions of the semiconductor layer 431, and the interlayer insulating layer 439 may comprise a via hole (not shown) exposing a portion of the first line 435b.

A first electrode 441a is positioned on the interlayer insulating layer 439, and source and drain electrodes 443a and 443b are also positioned on the interlayer insulating layer 439. The source and drain electrodes 443a and 443b are electrically connected to the semiconductor layer 431 via the first and second contact holes 437a and 437b, and a portion of the drain electrode 443b is positioned on the first electrode 441 so as to be electrically connected therewith.

A bank layer 445 exposing a portion of the first electrode 441 is positioned on the first electrode 441. An emitting layer 447 is positioned on the exposed portion of the first electrode 441.

A second electrode 449 is positioned on the emitting layer 447. The first electrode 441, the emitting layer 447, and the second electrode 449 constitute an organic light emitting diode 450.

As described above, the organic light emitting device according to the fourth exemplary embodiment comprises the dummy lines 435d positioned between the second lines 435c that supply DC power to the monitoring unit 420 and the third lines 435e that apply AC signals to the subpixels.

The dummy lines are electrically connected to the first lines 435b that supply a reference voltage to form a capacitance together with the third lines 435e, so occurrence of a signal interference between the third lines 435e that supply electrical signals to the display unit 410 and the second lines 435c can be prevented.

Therefore, because an accurate voltage can be transferred from the monitoring unit 420 to the display unit 410, the organic light emitting device according to the fourth exemplary embodiment can have the uniform luminance and improve the image quality.

Although the monitor pixel has shown and described in the first to fourth exemplary embodiments, the monitor pixel may be omitted. In this case, the first to fourth exemplary embodiments may include lines for supplying a voltage to the subpixel, and a shield layer and a dummy line for preventing the signal interference between the lines for applying the electrical signal so as to display an image on the subpixel.

As described above, the organic light emitting device according to the exemplary embodiments can improve the image quality of the screen.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art.

What is claimed is:

1. An organic light emitting device, comprising:
    a substrate;
    a display unit on the substrate, the display unit including a subpixel and a monitor pixel;
    a first line that supplies a voltage to the subpixel and the monitor pixel;
    a second line that supplies a direct current (DC) power to the monitor pixel;
    a third line that transfers an electrical signal used to display an image on the subpixel; and
    a dummy layer that is electrically connected to the first line and shields the second line.

2. The organic light emitting device of claim 1, wherein the second line and the third line are positioned to be adjacent to each other.

3. The organic light emitting device of claim 1, wherein the subpixel or the monitor pixel includes a thin film transistor including a semiconductor layer, a gate insulating layer on the semiconductor layer, a gate electrode positioned to correspond to a predetermined area of the semiconductor layer, source and drain electrodes electrically connected to the semiconductor layer, and an interlayer insulating layer providing insulation between the gate electrode and the source and drain electrodes.

4. The organic light emitting device of claim 3, wherein the subpixel or the monitor pixel includes a light emitting diode that is electrically connected to the thin film transistor and includes a first electrode, an emitting layer, and a second electrode.

5. The organic light emitting device of claim 4, wherein the emitting layer includes a phosphorescence material.

6. The organic light emitting device of claim 3, wherein the first to third lines include the same material as the gate electrode.

7. The organic light emitting device of claim 4, wherein the dummy layer includes the same material as the semiconductor layer and is electrically connected to the first line through the gate insulating layer.

8. The organic light emitting device of claim 4, wherein the dummy layer includes the same material as the first electrode and is electrically connected to the first line through the interlayer insulating layer.

9. The organic light emitting device of claim 4, wherein:
    the dummy layer includes first and second shield layers; and
    the first shield layer includes the same material as the semiconductor layer and is electrically connected to the first line through the gate insulating layer; and
    the second shield layer includes the same material as the first electrode and is electrically connected to the first line through the interlayer insulating layer.

10. The organic light emitting device of claim 1, further comprising a driver that is connected to the third line and applies a driving signal to the display unit.

11. The organic light emitting device of claim 10, further comprising a DC power supply unit that supplies a DC power to the monitor pixel and is positioned inside the driver.

12. The organic light emitting device of claim 4, wherein the dummy layer is positioned between the second and third lines and includes the same material as the gate electrode.

* * * * *